(12) United States Patent
Theobald

(10) Patent No.: US 6,294,946 B1
(45) Date of Patent: Sep. 25, 2001

(54) SWITCHING CIRCUIT WITH INTERMITTENTLY LOADED CHARGED CAPACITANCE

(75) Inventor: Stephen Theobald, Harboöre (DK)

(73) Assignee: Astra Aktiebolag, Sodertalje (SE)

( * ) Notice: Subject to any disclaimer, the term of this patent is extended or adjusted under 35 U.S.C. 154(b) by 0 days.

(21) Appl. No.: 09/297,870

(22) PCT Filed: Mar. 30, 1999

(86) PCT No.: PCT/SE99/00538

§ 371 Date: May 10, 1999

§ 102(e) Date: May 10, 1999

(87) PCT Pub. No.: WO99/50961

PCT Pub. Date: Oct. 7, 1999

(30) Foreign Application Priority Data

Mar. 30, 1998 (SE) .................................... 9801120

(51) Int. Cl.$^7$ .................................... H03K 17/92
(52) U.S. Cl. .................. 327/367; 327/554; 327/374; 327/205; 326/3
(58) Field of Search ................................ 327/337, 367, 327/374, 375, 205, 206, 554; 326/3

(56) References Cited

U.S. PATENT DOCUMENTS

| 4,047,052 | * | 9/1977 | Koubek et al. | 327/136 |
| 4,752,741 | * | 6/1988 | Kim et al. | 327/337 |
| 5,258,662 | * | 11/1993 | Skovmand | 327/544 |
| 5,331,230 | * | 7/1994 | Ichihara | 327/94 |
| 5,410,195 | * | 4/1995 | Ichihara | 327/94 |
| 5,477,185 | * | 12/1995 | Jouen | 327/579 |
| 5,973,518 | * | 10/1999 | Vallancourt | 327/94 |

* cited by examiner

*Primary Examiner*—Timothy P. Callahan
*Assistant Examiner*—An T. Luu
(74) *Attorney, Agent, or Firm*—Fish & Richardson P.C.

(57) ABSTRACT

A switching circuit, comprising: a first node for receiving a first voltage; a second node 502 for providing an output; a third node for receiving a second voltage; a capacitance 506 coupled between the second node 502 and the third node; means for intermittently charging the capacitance 506 to provide a first output voltage from the second node 502; and a switch 501 connected between the first node and the second node 502 for isolating the second node 502 from the first node when open and for discharging the capacitance 506 to provide a second output voltage when closed.

11 Claims, 5 Drawing Sheets

SWITCHING CIRCUIT WITH INTERMITTENTLY LOADED CHARGED CAPACITANCE

BACKGROUND OF THE INVENTION

The present invention relates a switching circuit. In particular, the present invention relates to a switching circuit comprising a switch which on activation discharges a capacitance.

Typically, a switching circuit utilises a switch to complete an electrical circuit. When the switch is closed the circuit is closed and when the switch is open the circuit is open. One disadvantage of such a switch is that power is dissipated while the switch remains closed.

It would be desirable to provide a switching circuit which consumes less power.

SUMMARY OF THE INVENTION

Accordingly, the present invention provides a switching circuit, comprising: a first node for receiving a first voltage; a second node for providing an output; a third node for receiving a second voltage; a capacitance coupled between the second node and the third node; means for intermittently charging the capacitance to provide a first output voltage from the second node; and a switch connected between the first node and the second node for isolating the second node from the first node when open and for discharging the capacitance to provide a second output voltage when closed.

In one embodiment the switching circuit further comprises a buffer connected to the second node.

In another embodiment the switching circuit further comprises a latch connected to the second node.

Preferably, the latch is a Schmitt trigger latch.

Preferably, the means for charging the capacitance comprises a second switch responsive to a control signal for connecting the second node to a voltage source.

In a preferred embodiment the control signal is a pulsed signal.

Preferably, the duration of a pulse is substantially less than the period between pulses.

More preferably, the pulse has a duration which is 1/500 of its period.

Preferably, the pulse has a duration of about 1 ms.

Preferably, the voltage source is a positive voltage and the first and second voltages are ground.

In one embodiment the capacitance comprises a stray capacitance.

Preferably, the switching circuit comprises a capacitor for providing at least a portion of the capacitance.

It will be appreciated that in the present invention, when the first switch is open, power is dissipated only while the capacitance charges. Once the capacitance has been charged and when the first switch is open negligible current will be drawn by the capacitor and negligible power will be consumed. When the first switch is closed, the voltage at the second node quickly discharges. When the second switch is then closed, the voltage at the second node increases in a stepwise fashion as the capacitance is intermittently charged. The voltage at the second node will depend upon the total charge supplied by the means for intermittently charging the capacitance and the value of the capacitance.

A preferred embodiment of the present invention will now be described hereinbelow by way of example only with reference to the accompanying drawings:

DETAILED DESCRIPTION OF THE INVENTION

Figure 4:
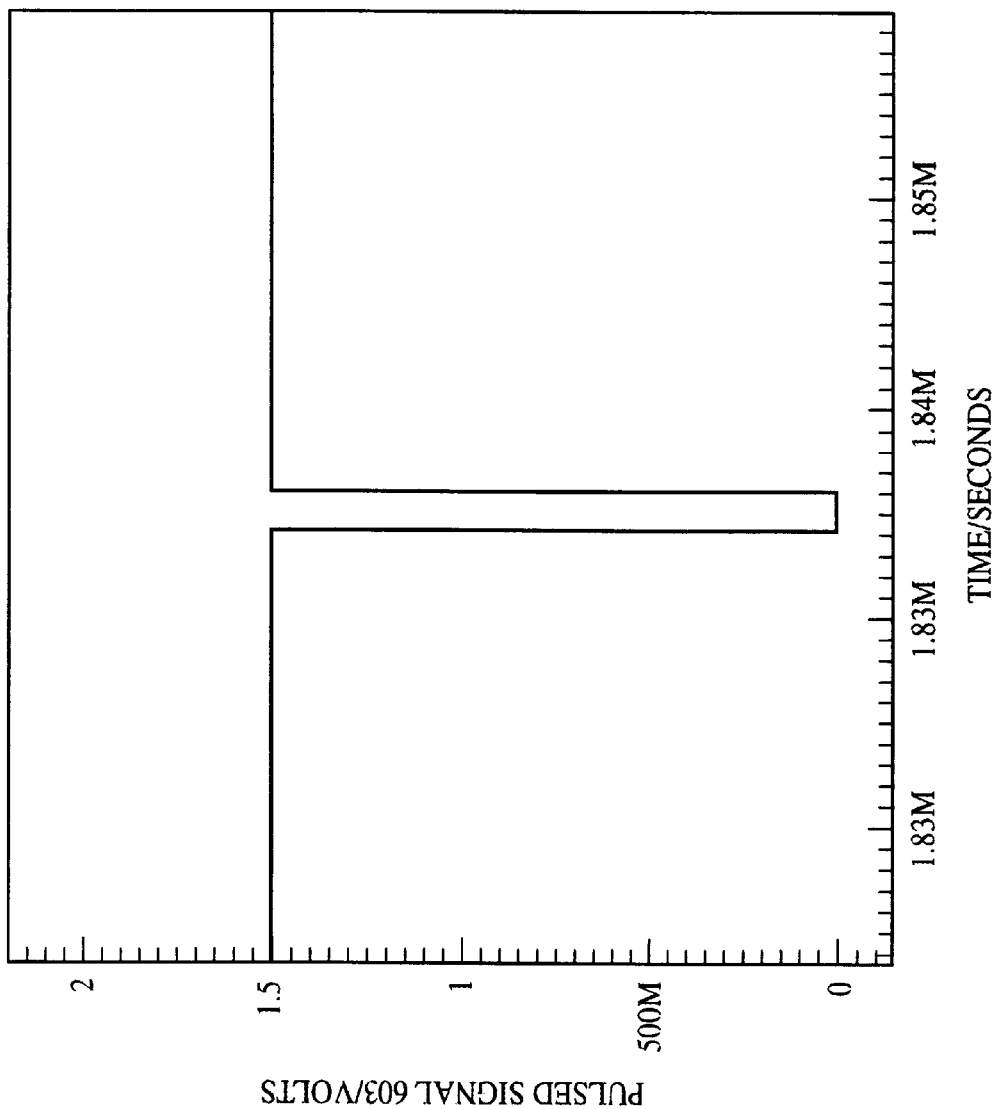
FIG. 4 illustrates a pulsed signal output from the clock generator of FIG. 3.
Figure 5:
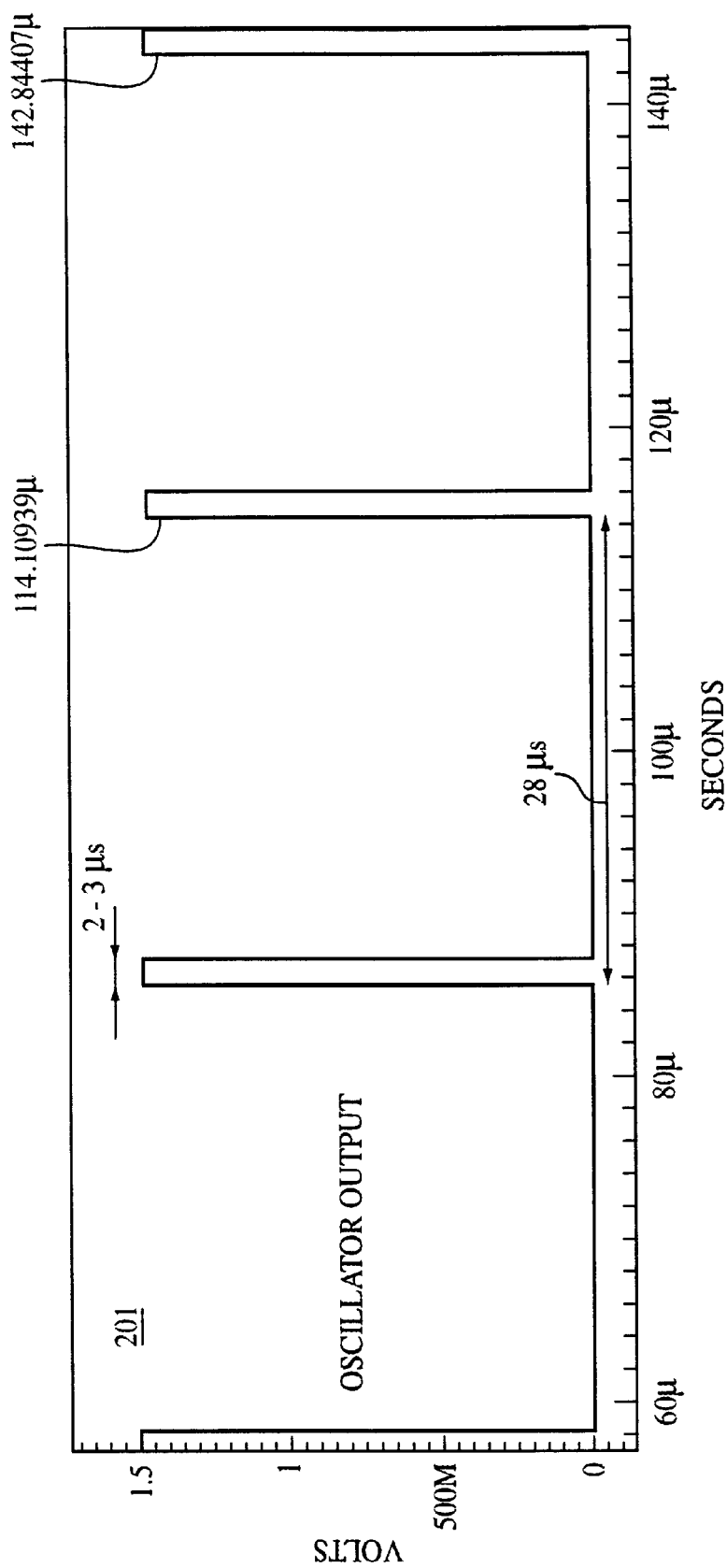
FIG. 5 illustrates the signal input to the clock generator of FIG. 3.

The switching circuit 500 includes a switch 501 which includes first and second terminals and a mechanism having a first configuration in which the first terminal is connected to the second terminal and a second configuration in which the first and second terminals are mutually electrically isolated. The first terminal of the switch 501 is connected to ground and the second terminal of the switch 501 is connected to an input node 502. A capacitance 506 exists between the input node 502 and ground. This capacitance may be a stray capacitance between the input node 502 and ground or a capacitor connected between the input node 502 and ground. The switching circuit 500 includes a p-channel FET 508, with a source connected to a positive voltage $V_{DD}$ and a drain connected to the input node 502. The switching circuit 500 further includes a Schmitt trigger 510. The input node 502 is connected to the input of a Schmitt trigger 510 and the output of the Schmitt trigger 510 produces an output signal 105. The output signal 105 is then supplied to debounce circuitry 602 which is controlled by a reset signal 1301 and an Fdebounce signal 403. The gate of the p-channel FET 508 receives a pulsed signal 603 from a clock signal generator 400. The form of the pulsed signal 603 is illustrated in FIG. 4. Generally, the pulsed signal 603 is high and is pulsed low at regular intervals with a frequency of 1 kHz. The duration of the pulse is from 1.5 to 3 $\mu$s which equates to a duty cycle of approximately 1/500. When the pulsed signal 603 is high the p-channel transistor 508 is switched off. When the pulsed signal 603 is pulsed low the transistor 508 switches on momentarily and charges the capacitor 506. When the first switch 501 is closed the input node 502 is connected to ground and the capacitor 506 is quickly discharged. The discharging of the capacitor 506 causes the output state of the Schmitt trigger 510 to change state causing the output signal 105 to be asserted high. When the first switch 501 is opened, the capacitor 506 is charged via the transistor 508 and the voltage at the input node 502 rises. The rising voltage, when passing a threshold value, causes the output state of the Schmitt trigger 510 to return to a low value. The voltage at the input node 502 is dependent on the current supplied by the transistor 508 and the value of the capacitance 506. By selecting the capacitance 506 and/or the size of the transistor 508 the latency between the opening of the switch 501 and the change in the output signal 105 can be controlled. The use of a pulsed to signal to operate the p-channel transistor 508 reduces power consumption.

Figure 1:
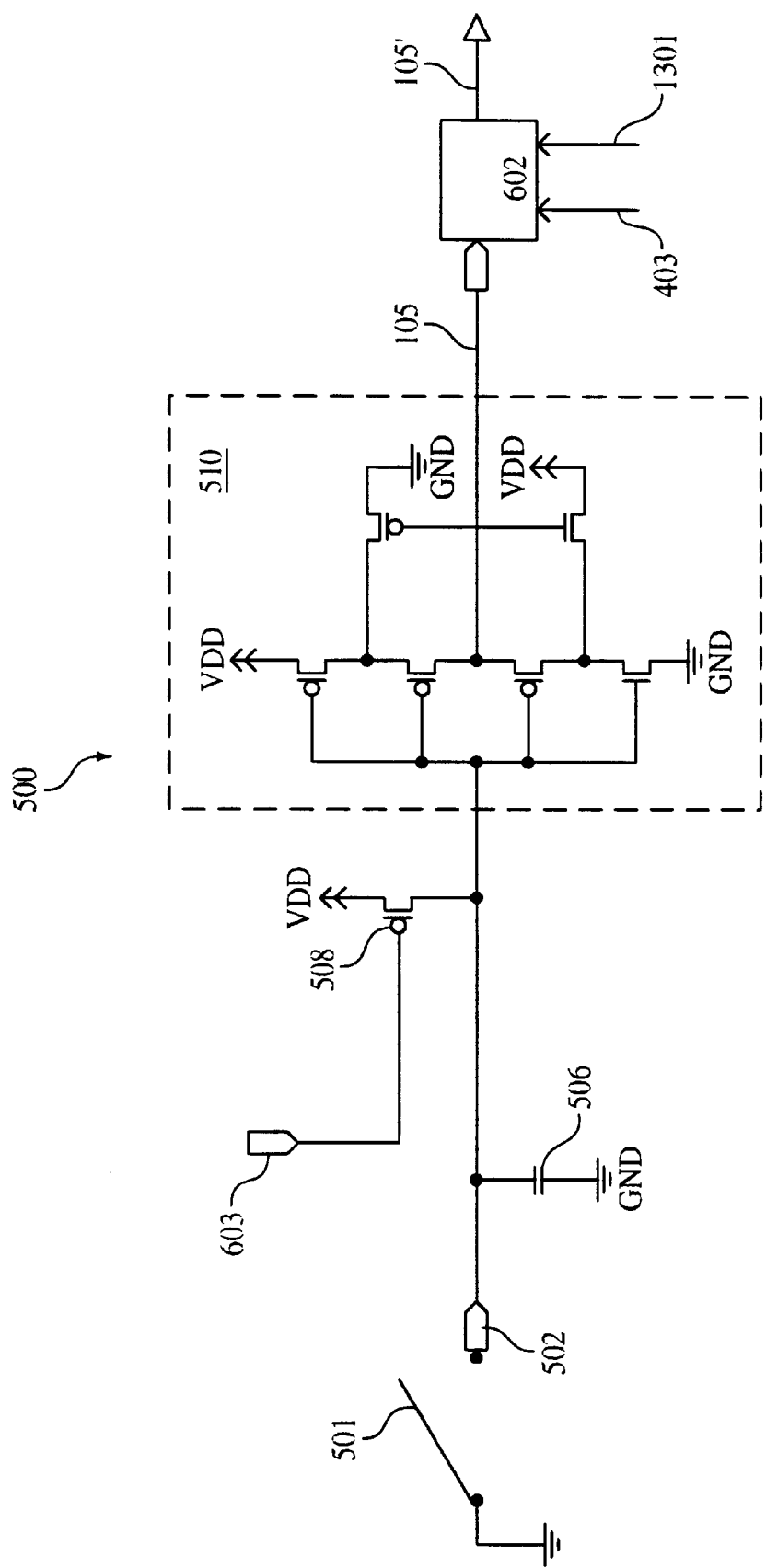
FIG. 1 is a schematic diagram of a switching circuit in accordance with a preferred embodiment of the present invention.
Figure 2:
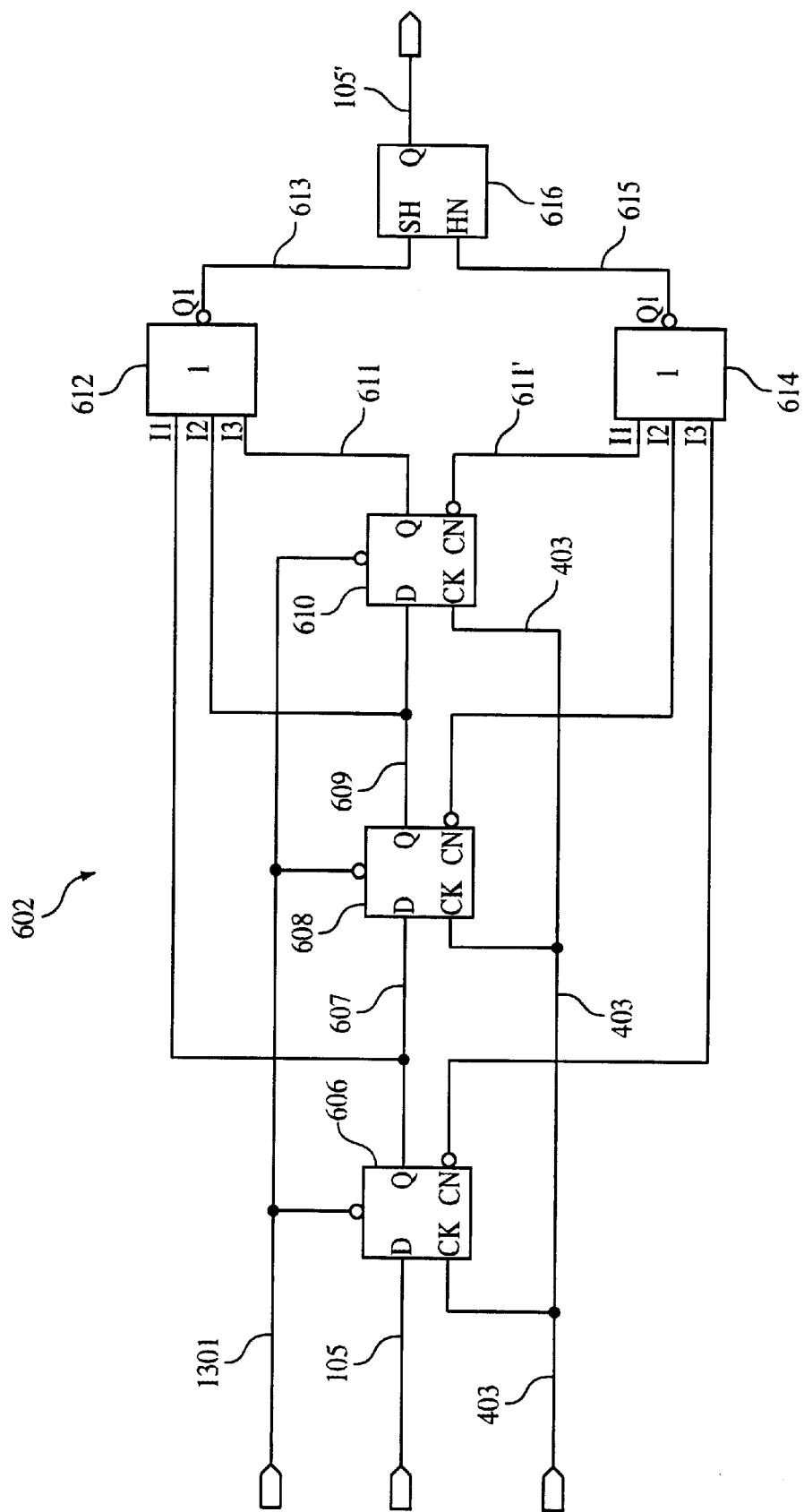
FIG. 2 is a schematic diagram of debounce circuitry in the switching circuit of FIG. 1.

The debounce circuitry is illustrated in farther detail in FIG. 2. The debounce circuitry receives the signal to be debounced 105, the reset signal 1301 and the Fdebounce signal 403 which is a regular square wave clock signal with a frequency of about 1 kHz. The signal to be debounced 105 is supplied to the input of a first D flip-flop 606. The non-inverted output of the first flip-flop 606 is supplied as an input to a second D flip-flop 608 and as a first input to a first three-input NAND gate 612. The inverted output of the first flip-flop 606 is supplied to a first input of a second three-input NAND gate 614. The non-inverted output of the second flip-flop 608 is supplied as an input to a third D flip-flop 610 and as a second input to the first three-input NAND gate 612. The inverted output of the second flip-flop 608 is supplied to a second input of the second three-input NAND gate 614. The non-inverted output of the third flip-flop 610 is supplied as a third input to the first three-input NAND gate 612. The inverted output of the third flip-flop 610 is supplied to a third input of the second three-input NAND gate 614. The outputs of the first and second NAND gates 612, 614 are supplied as inputs to an SR flip-flop 616, the output of which is the debounced signal. Each of the flip-flops is reset by the reset signal 1301 if asserted. Each of the D flip-flops is clocked by the Fdebounce signal 403. Consequently, if the input signal 105 has a transition from low to high, for example, and remains high for three clock cycles of the Fdebounce signal 403, then the debounced signal 105' also has a transition from low to high. If the input signal goes low, the debounced signal 105' goes or remains low.

Figure 3:
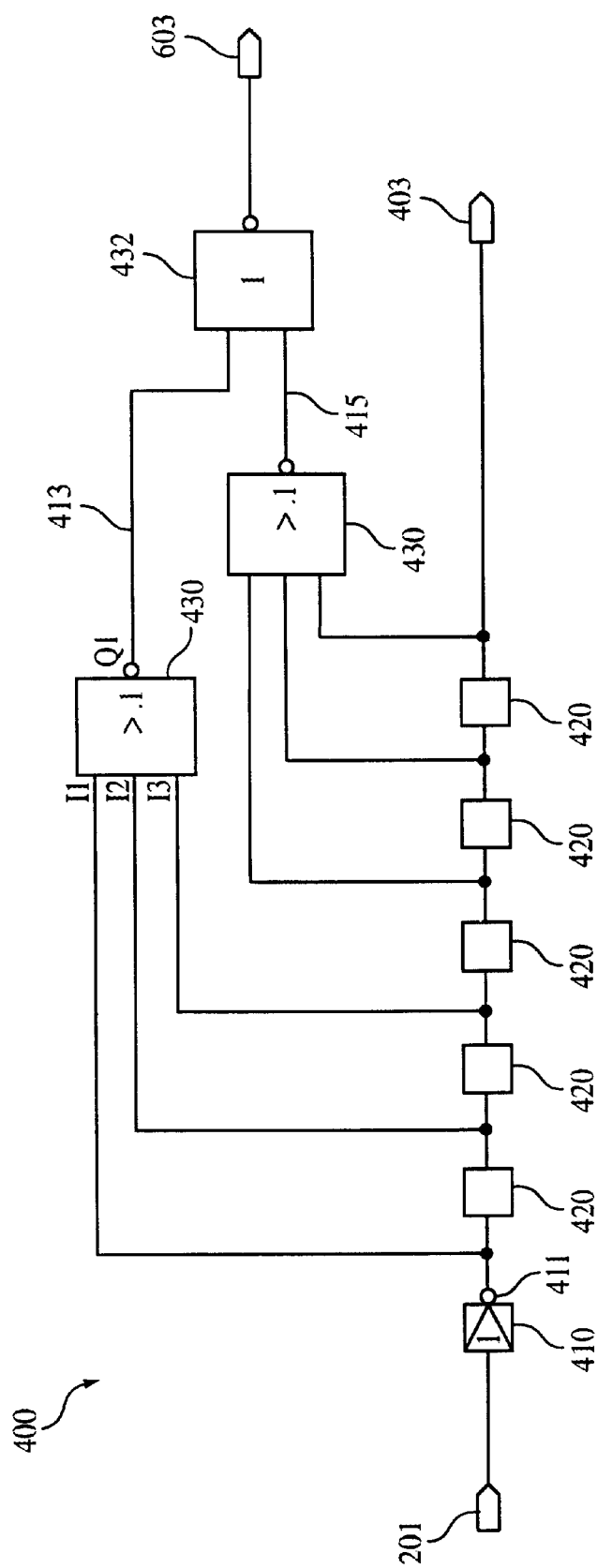
FIG. 3 is a schematic diagram of a clock generator for use with the switching circuit of FIG. 1.

Referring to FIG. 3, an output signal from an oscillator is supplied as an input signal 201 to a clock generator 400. The clock generator 400 produces pulsed signal 603 and Fdebounce signal 403. The input signal 201 is illustrated in FIG. 3. The pulsed signal 603 and the Fdebounce signal 403 have a frequency of about 1 kHz. However, the pulsed signal 603 is generally high but pulsed low for a few microseconds in each period whereas the Fdebounce signal 403 is a regular symmetric signal being high half of the time and low half of the time.

Referring to FIG. 3, the clock generator 400 has an inverter 410 for inverting the input signal 201 to produce an inverted signal 411. The inverted signal 411 is then supplied to the first one of a linear series of five frequency dividers 420. The output of each frequency divider 420 toggles on a rising edge at its input. Each frequency divider receives a clock signal and produces a regular square wave clock signal, with half the frequency of the input signal as an input to the next frequency divider in the linear series. The Fdebounce signal 403 is taken from the output of the fifth frequency divider. The inverted signal 411, the output of the first frequency divider 420 and the output of the second frequency divider 420 are combined in a NOR gate 430 to produce a signal 413. The output from the third, fourth and fifth frequency dividers 420 are each supplied to an input of a NOR gate 430 which produces a signal 415. The signals 413 and 415 are input to a NAND gate 432 to produce the pulsed signal 603.

Finally, it will be understood that the present invention has been described in its preferred embodiment and can be modified in many different ways within the scope of the appended claims.

What is claimed is:

1. A switching circuit, comprising:
   a first node for receiving a first voltage;
   a second node for providing an output;
   a third node for receiving a second voltage;
   a capacitance coupled between the second node and the third node;
   an intermittent charger that intermittently charges the capacitance to provide a first output voltage from the second node;
   a first switch connected between the first node and the second node for isolating the second node from the first node when open and for discharging the capacitance to provide a second output voltage when closed; and
   a buffer connected to said second node,
   said buffer being electrically conductively connected to said first when said first switch is closed,
   said buffer providing an output indicating when said first switch is in a closed position.

2. A switching circuit as claimed in claim 1, wherein said buffer comprises a latch connected to the second node.

3. A switching circuit as claimed in claim 2, wherein the latch is a Schmitt trigger latch.

4. A switching circuit as claimed in claim 1, wherein the intermittent charger comprises a second switch responsive to a control signal for connecting the second node to a voltage source $V_{DD}$.

5. A switching circuit as claimed in claim 4, wherein the control signal is a pulsed signal.

6. A switching circuit as claimed in claim 5, wherein the duration of a pulse is substantially less than the period between pulses.

7. A switching circuit as claimed in claim 6, wherein the pulse has a duration which is 1/500 of its period.

8. A switching circuit as claimed in claim 4, wherein the pulse has a duration of about 1 ms.

9. A switching circuit as claimed in claim 4, wherein the voltage source $V_{DD}$ is a positive voltage and the first and second voltages are ground.

10. A switching circuit as claimed in claim 1, wherein the capacitance 506 comprises a stray capacitance.

11. A switching circuit as claimed in claim 1, comprising a capacitor for providing at least a portion of the capacitance.

* * * * *

UNITED STATES PATENT AND TRADEMARK OFFICE
CERTIFICATE OF CORRECTION

PATENT NO.    : 6,294,946 B1
DATED         : September 25, 2001
INVENTOR(S)   : Stephen Theobald It is certified that error appears in the above-identified patent and that said Letters Patent is hereby corrected as shown below:

<u>Column 1,</u>
Line 6, after "relates", insert -- to --
Line 67, change ":" to -- . --

<u>Column 2,</u>
Line 61, after "pulsed", delete "to"
Line 64, change "farther" to -- further --

<u>Column 4,</u>
Line 23, after "first", insert -- switch --

Signed and Sealed this

Fifteenth Day of October, 2002

*Attest:*

*Attesting Officer*

JAMES E. ROGAN
*Director of the United States Patent and Trademark Office*